(12) United States Patent
Abe

(10) Patent No.: US 10,297,521 B2
(45) Date of Patent: May 21, 2019

(54) CIRCUIT SUBSTRATE, AND ELECTRONIC DEVICE INCLUDING SAME

(71) Applicant: Kyocera Corporation, Kyoto-shi, Kyoto (JP)

(72) Inventor: Yuuichi Abe, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/569,430

(22) PCT Filed: Apr. 26, 2016

(86) PCT No.: PCT/JP2016/063051
§ 371 (c)(1),
(2) Date: Oct. 26, 2017

(87) PCT Pub. No.: WO2016/175206
PCT Pub. Date: Nov. 3, 2016

(65) Prior Publication Data
US 2018/0247878 A1 Aug. 30, 2018

(30) Foreign Application Priority Data
Apr. 27, 2015 (JP) ................................ 2015-090530

(51) Int. Cl.
*H01L 23/367* (2006.01)
*H05K 1/02* (2006.01)
(Continued)

(52) U.S. Cl.
CPC .............. *H01L 23/367* (2013.01); *C22C 5/08* (2013.01); *H01L 21/486* (2013.01);
(Continued)

(58) Field of Classification Search
CPC ....... H01L 2224/16225; H01L 2224/97; H01L 2924/01047; H01L 2924/01322;
(Continued)

(56) References Cited

U.S. PATENT DOCUMENTS 4,795,670 A * 1/1989 Nishigaki ......... H01L 23/49883
174/257
5,439,732 A * 8/1995 Nagasaka ........... H01L 21/4867
257/E23.075
(Continued)

FOREIGN PATENT DOCUMENTS

JP  H03-91291 A   4/1991
JP  H05-201777 A  8/1993
(Continued)

*Primary Examiner* — Roy Potter
(74) *Attorney, Agent, or Firm* — Viering, Jentschura & Partner MBB

(57) ABSTRACT

A circuit substrate is provided with a base formed of ceramics. It includes a first face a second face; and a through hole penetrating from the first face to the second face; a through conductor: containing silver and copper as main components; disposed inside the through hole; and including a plurality of surfaces; and a metal layer in contact with at least one of the plurality of surfaces. The through conductor includes a eutectic region of silver and copper, disposed in a metal layer side of a diametrically center region of the through conductor; and a non-eutectic region of silver and copper, disposed in a central region of the diametrically center region of the through conductor.

14 Claims, 4 Drawing Sheets

(51) Int. Cl.
*H05K 1/09* (2006.01)
*H05K 1/11* (2006.01)
*H01L 23/15* (2006.01)
*H01L 23/498* (2006.01)
*C22C 5/08* (2006.01)
*H01L 21/48* (2006.01)
*H01L 23/373* (2006.01)
*B22F 1/00* (2006.01)
*B22F 7/04* (2006.01)

(52) U.S. Cl.
CPC .......... *H01L 21/4871* (2013.01); *H01L 23/15* (2013.01); *H01L 23/3731* (2013.01); *H01L 23/3736* (2013.01); *H01L 23/49827* (2013.01); *H01L 23/49866* (2013.01); *H05K 1/02* (2013.01); *H05K 1/09* (2013.01); *H05K 1/11* (2013.01); *B22F 1/00* (2013.01); *B22F 7/04* (2013.01); *H01L 23/3677* (2013.01)

(58) Field of Classification Search
CPC ............. H01L 23/49827; H01L 23/367; H01L 23/49866; H01L 23/15; H01L 21/486; H01L 23/3736; H01L 21/4871; H01L 23/3731; C22C 5/08
See application file for complete search history.

(56) References Cited

U.S. PATENT DOCUMENTS

| | | |
|---|---|---|
| 5,698,015 A | 12/1997 | Mohri et al. |
| 5,922,245 A | 7/1999 | Mohri et al. |
| 2017/0372997 A1* | 12/2017 | Tsukamoto ....... H01L 23/49838 |

FOREIGN PATENT DOCUMENTS

| | | |
|---|---|---|
| JP | H06-52819 A | 2/1994 |
| JP | H0946013 A | 2/1997 |
| JP | H11-340600 A | 12/1999 |
| JP | 2009-059789 A | 3/2009 |
| JP | 2009289900 A | 12/2009 |
| JP | 2012043822 A | 3/2012 |

* cited by examiner

US 10,297,521 B2

CIRCUIT SUBSTRATE, AND ELECTRONIC DEVICE INCLUDING SAME

RELATED APPLICATIONS

The present application is a national stage entry according to 35 U.S.C. § 371 of PCT application No.: PCT/JP2016/063051 filed on Apr. 26, 2016, which claims priority from Japanese application No.: 2015-090530 filed on Apr. 27, 2015, is incorporated herein by reference in its entirety.

FIELD

The present disclosure relates to a circuit substrate, and to an electronic device comprising the circuit substrate and an electronic component mounted thereon.

BACKGROUND

There is known an electronic device wherein various electronic components such as a semiconductor element, a heat-generating element, and a Peltier element, are mounted on a circuit substrate including a metal layer on a base formed of ceramics. An electronic component mounted on such a circuit substrate generates heat when operating. Because of an increased integration of electronic components and a reduction in size and thickness of electronic devices in recent years, an amount of heat applied to a volume of a circuit substrate is increasing, and therefore, in addition to a demand for there to be no separation at a junction between the base formed of ceramics and the metal layer, there is a demand for a circuit substrate with high heat dissipation.

Because of this demand, using a base including a through hole, improvement of heat dissipation is carried out utilizing a conductor provided across the metal layer inside the through hole. For example, a non-shrinking metal paste including a conductive powder which contains a metal powder as a main component, an expanding agent, and a vehicle is proposed in Patent Literature 1 as a metal paste which forms a through conductor.

CITATION LIST

Patent Literature

Patent Literature 1: Japanese Unexamined Patent Publication JP-A 9-46013 (1997)

SUMMARY

A circuit substrate of the present disclosure includes a base, a through conductor, and a metal layer. The base is formed of ceramics, and includes a first face, a second face and a through hole. The through hole is penetrates from a first face to a second face. The through conductor contains silver and copper as main components, and is disposed inside the through hole. The through conductor further includes a plurality of surfaces. The metal layer is in contact with at least one of the plurality of surfaces. The through conductor includes a eutectic region of silver and copper and a non-eutectic region of silver and copper. The eutectic region is disposed in a metal layer side region of a diametrically center region of the through conductor. The non-eutectic region is disposed in a central region of the diametrically center region of the through conductor.

DESCRIPTION OF EMBODIMENTS

Figure 1:
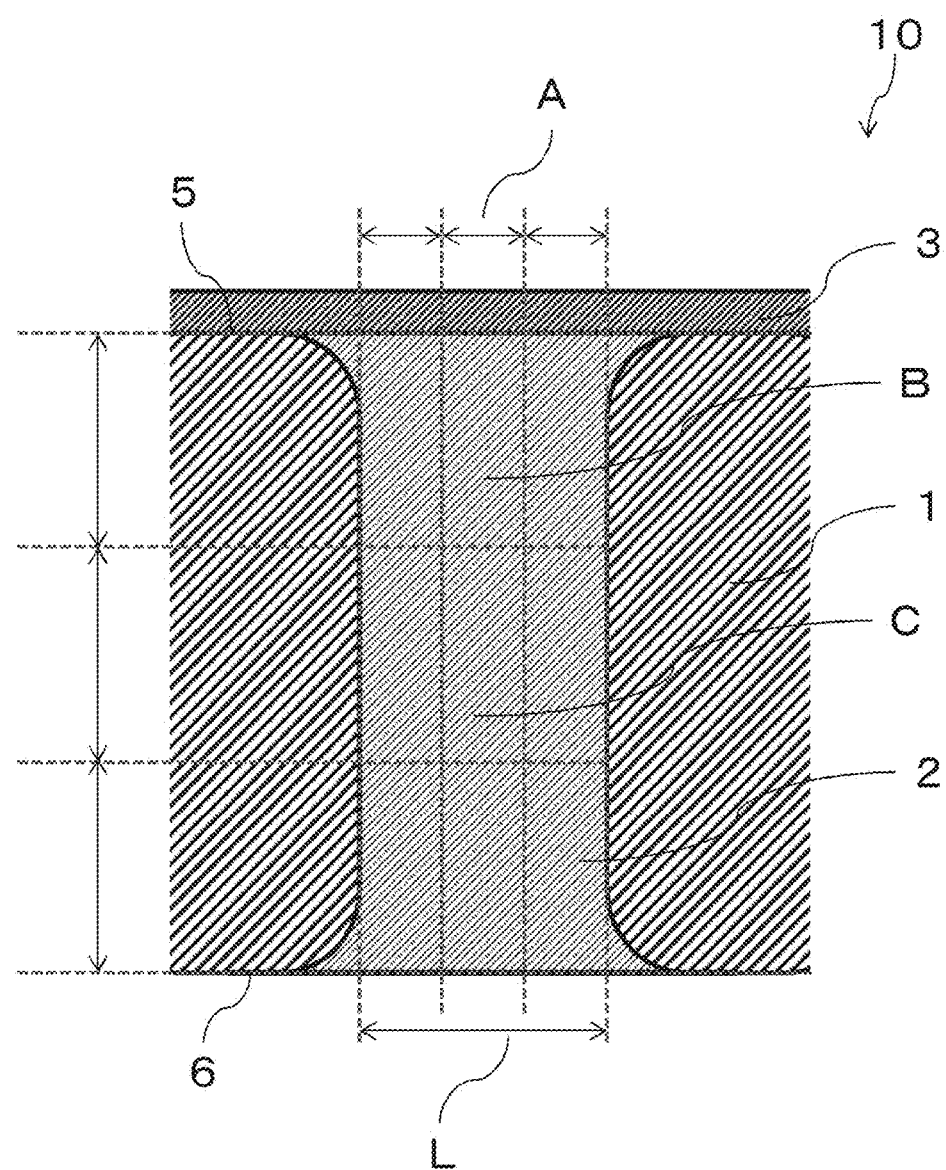
FIG. 1 is a sectional view schematically illustrating an example of a circuit substrate of the present disclosure.

Hereafter, a circuit substrate of the present disclosure will be described in detail while referring to the drawings.

Figure 2:
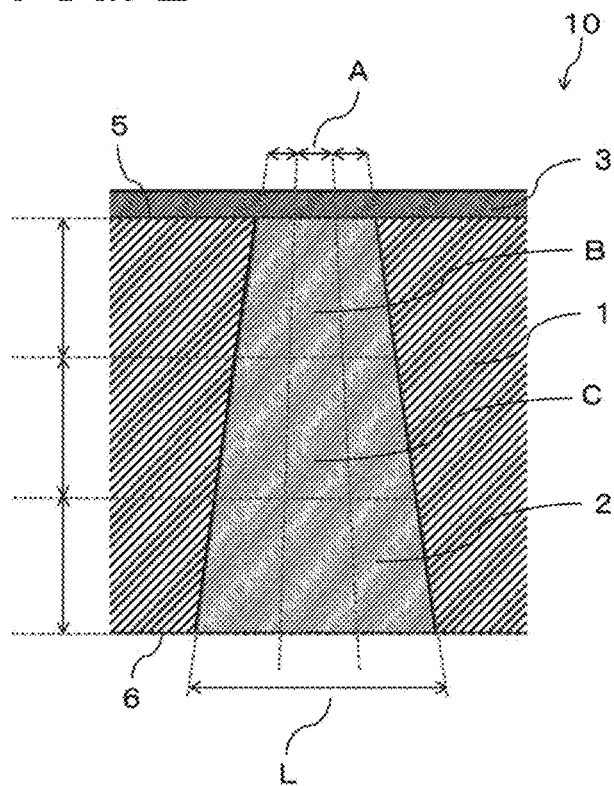
FIG. 2 is a sectional view schematically illustrating another example of a circuit substrate of the present disclosure.

FIG. 1 is a sectional view schematically illustrating an example of a circuit substrate of the present disclosure. FIG. 2 is a sectional view schematically illustrating another example of a circuit substrate of the present disclosure. According to the present disclosure, a circuit substrate 10 shown in FIG. 1 and FIG. 2 includes a base 1 formed of ceramics, a through conductor 2 and a metal layer 3. The base includes first and second faces, and a through hole penetrating from the first face 5 to the second face 6. The through conductor 2 contain silver and copper as main components, is located inside the through hole, and includes a plurality of surfaces. The metal layer 3 is in contact with at least one of the surfaces. As shown in FIG. 1 and FIG. 2, the first face 5 is an upper face of the base 1, and the second face 6 is a lower face of the base 1.

An example wherein an opened area of the first face 5 and an opened area of the second face 6 are the same is shown as the through hole in FIG. 1. Meanwhile, an example wherein an opened area of the second face 6 is greater than an opened area of the first face 5, and a diameter of the through hole increases from the first face 5 toward the second face 6, is shown as the through hole in FIG. 2. A hand drum form which widens toward the first face 5 and second face 6 is shown as a sectional form of the through hole in FIG. 1, but this may be simply a rectangular form. FIG. 1 and FIG. 2 show an example including the metal layer 3 only on the first face 5 side of the through conductor 2. However, the metal layer may be disposed on the second face 6 side of the through conductor 2, too.

A main component of the through conductor 2 is a component containing a total mass of silver and copper of 70% by mass or more of a total of 100% by mass of all components constituting the through conductor 2. The main component may also be a component containing 50% by mass or more of silver alone.

The through conductor 2 constituting the circuit substrate 10 of the present disclosure includes a eutectic region of silver and copper (hereafter referred to simply as a eutectic region) and a non-eutectic region of silver and copper (hereafter referred to simply as a non-eutectic region), and the eutectic region exists in a metal layer side region B in a diametrically center region A of the through conductor 2, and the non-eutectic region exists in a central region C in the diametrically center region A of the through conductor 2. As shown in FIG. 1 and FIG. 2, the diametrically center region A is the middle region of a distance (L) from one inner face of the through hole to another inner face divided into three equal portions in a section cut in a thickness direction of the base 1 so that the volume of the through conductor 2 is in approximately equal portions. In other words, when the through conductor 2 is cylindrical, the diametrically center region A is three-dimensionally a circular cylinder with a radius of ⅓ L based on a center. When the sectional form of the through conductor 2 is a hand drum form, as shown in FIG. 1, the diametrically center region A is specified based on a linear imaginary line in contact with an inner face.

Herein, a method for manufacturing the section shown in FIG. 1 and FIG. 2 will be described. In the case of the circuit substrate 10 including the base 1, through conductor 2, and metal layer 3, firstly, the metal layer 3 is removed by etching, polishing, or otherwise. Then, polishing is carried out using a cross-section polisher (CP) so that a line connecting the centers of the two surfaces of the exposed through conductor 2 forms part of a cut face. By so doing, the section shown in FIG. 1 and FIG. 2, cut in the thickness direction of the base 1 so that the volume of the through conductor 2 is divided into approximately equal portions, can be obtained.

The metal layer side region B in the diametrically center region A is a region on the metal layer 3 side of regions in which a distance from the first face 5 to the second face 6 of the base 1 is divided into three equal portions in the diametrically center region A. When a metal layer is also formed on the surface on the second face 6 side of the through conductor 2, upper and lower portions of the diametrically center region A in FIG. 1 and FIG. 2 form the metal layer side region B.

The central region C in the diametrically center region A is a region in the center of regions in which the distance from the first face 5 to the second face 6 of the base 1 is divided into three equal portions in the diametrically center region A.

Figure 3A:
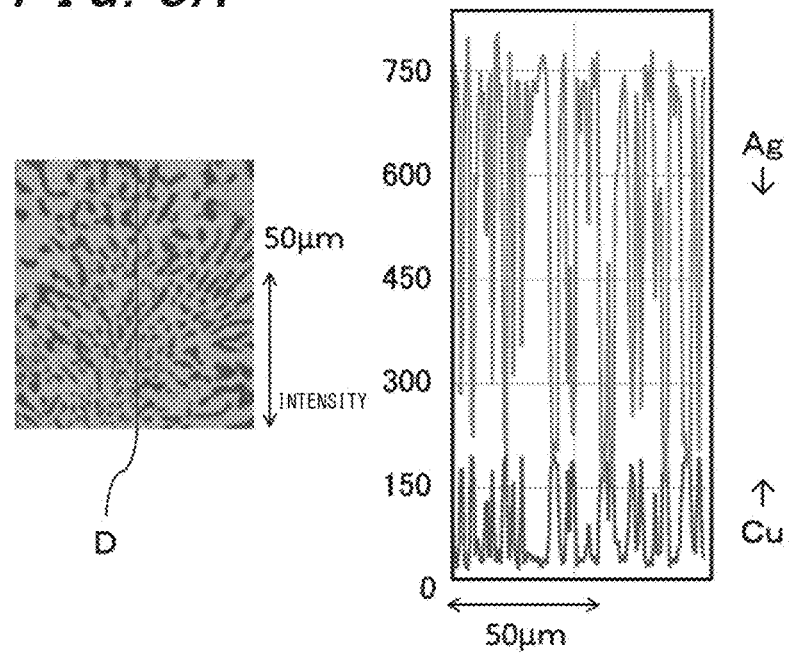
FIG. 3A is a backscattered electron image photograph of a metal layer side region B and a result of line analysis along a line D using an energy dispersive X-ray analyzer.
Figure 3B:
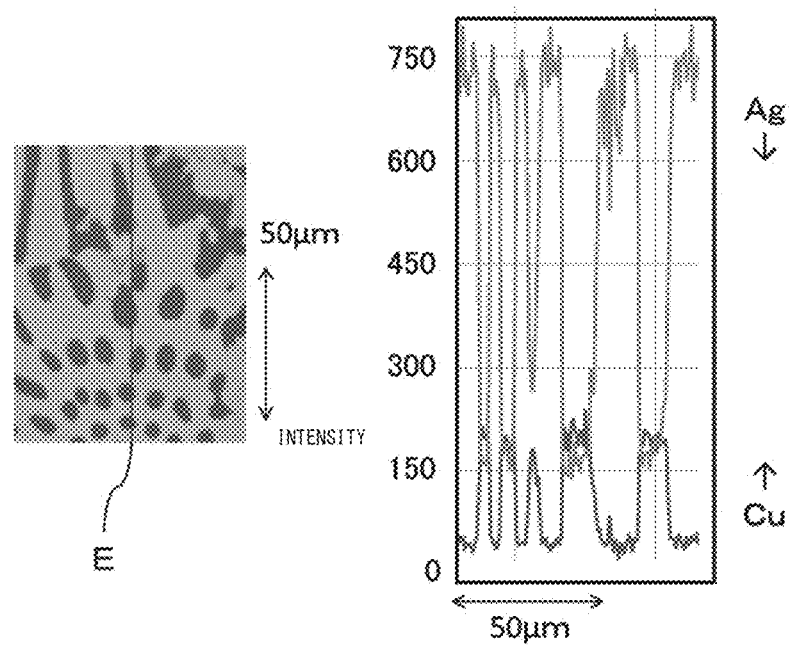
FIG. 3B is a backscattered electron image photograph of a central region C and a result of line analysis along a line E using an energy dispersive X-ray analyzer.

Next, the eutectic region and non-eutectic region will be described, using FIG. 3A and FIG. 3B. FIG. 3A is a backscattered electron image photograph of the metal layer side region B shown in FIG. 1 and FIG. 2, and a result of line analysis along a line D using an energy dispersive X-ray analyzer. FIG. 3B is a backscattered electron image photograph of the central region C shown in FIG. 1 and FIG. 2, and a result of line analysis along a line E using an energy dispersive X-ray analyzer.

Herein, a backscattered electron image (hereafter referred to simply as a BEM) is an image of electrons reflected from a sample surface detected using a scanning electron microscope (SEM) when the sample is irradiated with an electron beam.

The line analysis is carried out using an energy dispersive X-ray analyzer (EDX) attached to an SEM. According to results of the line analyses along line D and line E in the BEM photographs in FIG. 3A and FIG. 3B respectively, intensity of a characteristic X-ray detected from silver is shown on an upper side while intensity of a characteristic X-ray detected from copper is shown on a lower side.

The eutectic region is a region in the line analysis result in which the number of copper peaks exceeding 10% of total intensity is ten or more per 50 μm, as shown in FIG. 3A. The non-eutectic region is a region in the line analysis result in which the number of copper peaks exceeding 10% of total intensity is less than ten per 50 μm, as shown in FIG. 3B. The peak count is taken at the top of the peak, the number of copper peaks per 50 μm of a scale position in FIG. 3A is eleven, and the number of copper peaks per 50 μm of a scale position in FIG. 3B is eight. In other words, peak widths of silver and copper in the eutectic region are small, and peak widths of silver and copper in the non-eutectic region are large. Also, expressed in another way, in the eutectic region in the BEM, portions shown in a dark color are of a small size and intervals between portions shown in a dark color are small, while in the non-eutectic region, portions shown in a dark color are of a large size and intervals between portions shown in a dark color are large.

The circuit substrate 10 of the present disclosure, which satisfies the heretofore described configuration, has good heat dissipation and junction reliability. The circuit substrate 10 of the present disclosure has good heat dissipation because, firstly, the through conductor 2 contains silver and copper, which have high thermal conductivity, as the main component. Since the eutectic region existing in the metal layer side region B in the diametrically center region A is a region formed through a eutectic reaction of silver and copper caused by heat treatment, there are few voids. Therefore, heat generated by an electronic component is easily transmitted via the metal layer 3 to the through conductor 2. As the eutectic region exists in the metal layer side region B in the diametrically center region A, heat dissipation can be increased.

The circuit substrate 10 of the present disclosure has good junction reliability because an indentation in the surface of the metal layer 3 in contact with the through conductor 2 is small. Generally, when a metal paste which forms the through conductor 2 is loaded into the through hole, the metal paste fills the through hole, but because of shrinkage due to organic vehicle loss, metal welding, and the like, during heat treatment for forming the through conductor 2, the surface of the through conductor 2 is liable to become indented. However, in the through conductor 2 in the circuit substrate 10 of the present disclosure, since the non-eutectic region exists in the central region C in the diametrically center region A, there is little shrinkage during the heat treatment of the metal paste that forms the through conductor 2, and an indentation in the surface of the metal layer 3 in contact with the through conductor 2 is small. Since an indentation in the surface of the metal layer 3 is small, a junction area between the metal layer 3 and an electronic component mounted on the metal layer 3 can be sufficiently obtained. Since the area of the junction with the electronic component can be sufficiently obtained, heat dissipation is also improved.

Herein, an indentation measurement method will be described. Taking the surface of the metal layer 3 in contact with the through conductor 2 as a measurement face, indentation (depth) can be measured by using a surface roughness meter or laser displacement meter. The amounts of silver and copper contained in the through conductor 2 can be obtained by measuring using an X-ray fluorescence spectrometer (XRF) or an ICP emission spectrometer (ICP).

A main component of the metal layer 3 constituting the circuit substrate 10 of the present disclosure may be silver and copper. Herein, the main component of the metal layer 3 is a component containing a total mass of silver and copper of 70% by mass or more of a total of 100% by mass of all components constituting the metal layer 3. The main component may also be a component containing 50% by mass or more of silver alone. When the main component of the metal layer 3 is silver and copper, which have high thermal conductivity, in this way, heat dissipation can be further improved. The amounts of silver and copper contained in the metal layer 3 can be obtained by measuring using the XRF or ICP.

In the circuit substrate 10 of the present disclosure, a component constituting the base 1, and a first active metal layer containing at least one selected from titanium, zirconium, hafnium, and niobium (hereafter, also referred to collectively as active metals), may exist between the base 1 (the inner face of the through hole) and the through conductor 2. Herein, in order to satisfy the heretofore described configuration, at least one selected from titanium, zirconium, hafnium, and niobium is included in the metal paste which forms the through conductor 2, and the obtained metal paste is subjected to heat treatment.

Since the first active metal layer is a layer formed by the reaction of the active metal included in the metal paste with the component constituting the base 1 during heat treatment in this way, existence of the first active metal layer means that the inner face of the through hole and the through conductor 2 are securely joined. Because of this, when the first active metal layer exists between the inner face of the through hole and the through conductor 2, the through conductor 2 less becomes separated from the inner face of the through hole due to heat generated by an electronic component, and therefore high thermal reliability is achieved.

Since the inner face of the through hole and the through conductor 2 are securely joined, the amount released to the base 1 of heat generated by an electronic component increases, and therefore heat dissipation is also improved. In terms of more securely joining the inner face of the through hole and the through conductor 2, the active metal constituting the first active metal layer is preferably titanium. Specifically, in a case where the active metal is titanium and the base 1 is formed of oxide-based ceramics, the first active metal layer is titanium oxide; in a case where the base 1 is formed of nitride-based ceramics, the first active metal layer is titanium nitride; and in a case where the base 1 is formed of carbide-based ceramics, the first active metal layer is titanium carbide.

The existence or absence of the first active metal layer can be confirmed by carrying out area analysis using an EDX or electron probe microanalyzer (EPMA), taking a face in which the inner face of the through hole and the through conductor 2 can be observed in the section shown in FIG. 1 and FIG. 2 as a measurement face. Specifically, when the active metal is titanium and the base 1 is nitride-based ceramics, it can be said that the first active metal layer exists when a position in which titanium and nitrogen exist together follows the inner face of the through hole. When using an X-ray diffractometer (XRD), which can measure a minute region, a compound existing in the inner face of the through hole can be identified.

In the circuit substrate 10 of the present disclosure, the through conductor 2 may include at least one selected from molybdenum, tantalum, osmium, rhenium, and tungsten (hereafter, also referred to collectively as refractory metals). Herein, in order to satisfy the heretofore described configuration, at least one selected from molybdenum, tantalum, osmium, rhenium, and tungsten is included in the metal paste which forms the through conductor 2. The through conductor 2 includes at least one selected from molybdenum, tantalum, osmium, rhenium, and tungsten, where the one has higher melting points than those of silver and copper which are the main components. Accordingly, a portion which does not melt easily in the metal paste during heat treatment does exist. As a result, this portion can serve as an aggregate to suppress shrinkage, and indentation of the surface of the metal layer 3 in contact with the through conductor 2 can be reduced further.

Because of this, heat dissipation and junction reliability are still more good when the heretofore described configuration is satisfied. The existence or absence of a refractory metal can be confirmed by carrying out area analysis using the EDX or EPMA.

A sintered body containing aluminum nitride, silicon nitride, alumina, or silicon carbide as a main component, and a single crystal thereof, can be used as the base 1 constituting the circuit substrate 10 of the present disclosure. Herein, a main component of the sintered body indicates a component occupying 70% by mass or more of a total of 100% by mass of all components constituting the sintered body. In order to confirm whether or not a component of interest is a main component for, for example, the base 1 that is formed of aluminum nitride, a content of aluminum (Al) may be measured by using the XRF or ICP, and then the content of Aluminum is converted to a content of aluminum nitride (AlN).

If the base 1 constituting the circuit substrate 10 of the present disclosure is formed of nitride-based ceramics such as aluminum nitride or silicon nitride, the circuit substrate 10 can have improved dissipation due to high thermal conductivity of nitride-based ceramics.

Figure 4:
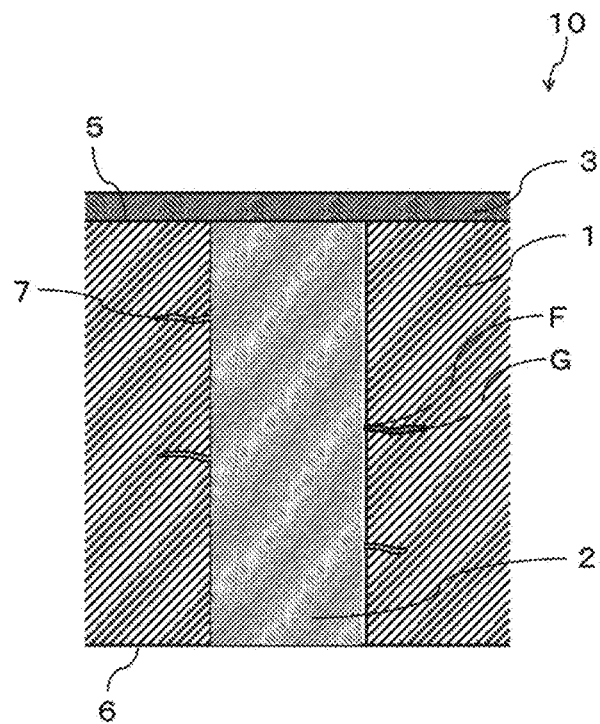
FIG. 4 is a sectional view schematically illustrating still another example of a circuit substrate of the present disclosure.

FIG. 4 is a sectional view schematically illustrating still another example of a circuit substrate of the present disclosure. As shown in FIG. 4, the through conductor 2 constituting the circuit substrate 10 of the present disclosure may have a multiple of an extended portion 7 which extends from the inner face of the through hole toward the base 1 (hereafter referred to simply as the extended portion 7). When the heretofore described structure is satisfied, an anchoring effect caused by the extended portion 7 comes into effect, and the inner face of the through hole and the through conductor 2 are securely joined, whereby the through conductor 2 less becomes separated from the inner face of the through hole due to heat generated by an electronic component, and therefore high thermal reliability is achieved.

The extended portion 7 constituting the circuit substrate 10 of the present disclosure is long and thin. If an average length of the extended portion 7 is 5 µm or more and 20 µm or less, the inner face of the through hole and the through conductor 2 can be still more securely joined owing to the anchoring effect of the extended portion 7, without causing a drop in the mechanical strength of the base 1.

Herein, the average length of the extended portion 7 is calculated using the following method. Firstly, the circuit substrate 10 is cut as shown in FIG. 4. Then, an observation face is obtained by polishing the section face using the CP. Then, the observation face is observed using an SEM, and a photograph is taken. Then, the length of each extended portion 7 in the photograph is measured using an image analyzer or the like, and an average value of the lengths of the extended portions 7 is calculated. The length of the extended portion 7 indicates the length of a line which connects a point F and a point G of the extended portion 7 so as to pass through the center of the width of the extended portion 7, as shown in FIG. 4.

In the circuit substrate 10 of the present disclosure, a component constituting the base 1, and a second active metal layer containing at least one selected from titanium, zirconium, hafnium, and niobium, may exist between the base 1 and the metal layer 3. Herein, in order to satisfy the heretofore described configuration, the above-mentioned active metal is included in the metal paste which forms the metal layer 3, and the obtained metal paste is subjected to heat treatment to form the metal layer 3.

Since the second active metal layer is a layer formed by the reaction of the active metal included in the metal paste with the component constituting the base 1 during heat treatment in this way, existence of the second active metal layer means that the metal layer 3 and the base 1 are securely joined. Because of this, when the second active metal layer exists between the base 1 and the metal layer 3, the metal layer 3 less becomes separated from the base 1 due to heat generated by an electronic component, and therefore high thermal reliability is achieved. The existence or absence of the second active metal layer can be confirmed using the same method as when confirming the existence or absence of the first active metal layer, except that a measurement face is taken to be between the base 1 and metal layer 3.

In the present disclosure, the circuit substrate 10 may include on the metal layer 3 a coating layer composed of at least one selected from silver, copper, nickel, palladium, platinum, and gold. When the heretofore described configuration is satisfied, a process of joining with bonding wire is easily carried out using the coating layer, and furthermore, oxidation corrosion of the metal layer 3 can be reduced.

Figure 5:
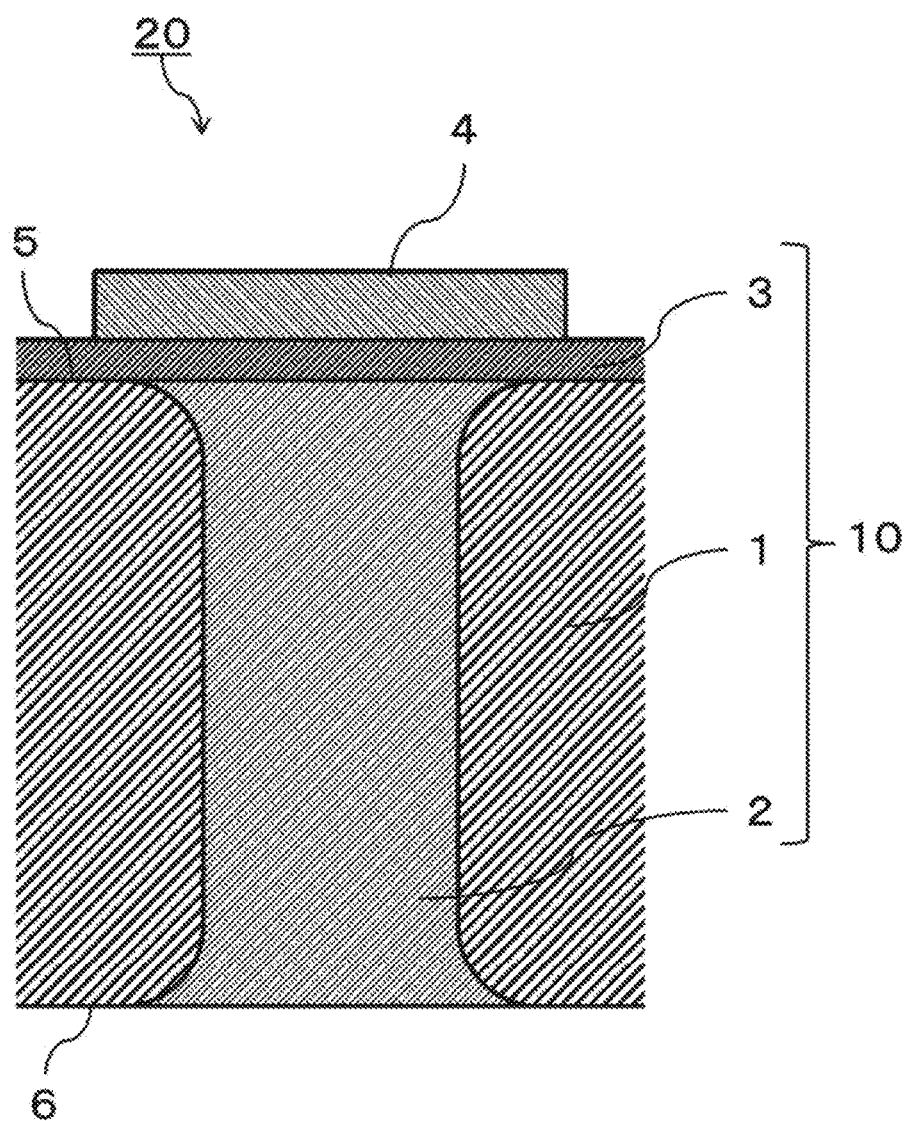
FIG. 5 is a sectional view schematically illustrating an example of an electronic device of the present disclosure.

Next, an electronic device 20 of the present disclosure will be described, using FIG. 5. The electronic device 20 of the present disclosure shown in FIG. 5 is formed by mounting an electronic component 4 on the circuit substrate 10 of the present disclosure, and has high reliability owing to the good heat dissipation and junction reliability of the circuit substrate 10 of the present disclosure. FIG. 5 shows an example including the metal layer 3 on the surface of the through conductor on the first face 5 side, and shows the electronic component 4 on the metal layer 3. However, having the metal layer 3 on the surface of the through conductor 2 on the second face 6 side, the electronic component 4 may be disposed on the metal layer 3.

A semiconductor element, a heat-generating element for sublimation type thermal printer head or thermal inkjet printer head, a Peltier element can be used for the electronic component 4. The semiconductor element includes a light emitting diode (LED) element, insulated gate bipolar transistor (IGBT) element, intelligent power module (IPM) element, metal-oxide-semiconductor field-effect transistor (MOSFET) element, freewheeling diode (FWD) element, giant transistor (GTR) element, or Schottky barrier diode (SBD) element.

Hereafter, an example of a method for manufacturing the circuit substrate 10 of the present disclosure will be described.

Firstly, the base 1 which contains aluminum nitride as a main component and which includes a through hole is prepared by using a commonly-known method.

Next, the metal paste which forms the through conductor 2 and the metal paste which forms the metal layer 3 are prepared. In order to distinguish these pastes, the metal paste which forms the through conductor 2 is referred to as a first metal paste, and the metal paste which forms the metal layer 3 is referred to as a second metal paste.

Firstly, silver powder with an average particle size of 1.5 μm or more and 5.0 μm or less, copper powder with an average particle size of 1.5 μm or more and 5.0 μm or less, and an organic vehicle are prepared, and they are weighed by a desired amount to prepare the first metal paste and the second metal paste. Specifically, the first metal paste has a composition having more copper than a eutectic composition of silver and copper (mass ratio 72:28), for example, a mass ratio of 60:40 to 70:30. The second metal paste is preferably a composition nearer than the first metal paste to the eutectic composition.

When the first metal paste has the composition having more copper than the eutectic composition in this way, a non-eutectic region of silver and copper can be caused to exist in a central region of a diametrically center region of the through conductor 2. In order to adopt a configuration that includes the metal layer 3 in contact with a surface of the through conductor 2, the first metal paste is covered with the second metal paste of the heretofore described configuration, whereby the silver in the second metal paste penetrates into the first metal paste side during heat treatment, and a eutectic region of silver and copper exists in a region on the metal layer 3 side in the diametrically center region of the through conductor 2.

The organic vehicle indicates an organic binder dissolved in an organic solvent, and, for example, one, or a mixture of two or more, selected from acrylics such as polybutyl methacrylate or polymethyl methacrylate, celluloses such as nitrocellulose, ethylcellulose, cellulose acetate, or butylcellulose, polyethers such as polyoxymethylene, and polyvinyls such as polybutadiene or polyisoprene, can be used as the organic binder.

One, or a mixture of two or more, selected from carbitol, carbitol acetate, α-terpineol, metacresol, dimethylimidazole, dimethylimidazolidinone, dimethylformadide, diacetone alcohol, triethylene glycol, paraxylene, ethyl lactate, and isophorone, can be used, for example, as the organic solvent.

Then, after preparing the first metal paste and second metal paste, the base 1, which contains aluminum nitride as the main component, is subjected to heat treatment at a temperature of 800° C. or higher and 900° C. or lower, in an atmospheric environment. Subsequently, the first metal paste is loaded into the through hole and dried. Next, using a commonly-known screen printing method or the like, the second metal paste is printed so as to cover the dried first metal paste, and dried. Subsequently, the circuit substrate 10 of the present disclosure can be obtained by carrying out heat treatment. As heat treatment conditions, the circuit substrate 10 is held at a maximum temperature of 790° C. or higher and 860° C. or lower, in a vacuum environment for 3 minutes or longer and 15 minutes or shorter.

The metal layer 3 which contains silver and copper as the main components is formed in the heretofore described manufacturing method. For producing a layer which is formed of an metal or metals other than silver and copper as the main components, the metal or the metals may be formed by plating after polishing the metal layer 3 using a lapping process or otherwise. For example, a layer formed of a new, arbitrary metal may be prepared by forming a thin layer of titanium and copper by sputtering, forming a resist pattern on the thin layer by photolithography, forming a new copper pattern using an electrolytic copper plating, removing the resist pattern, and removing a thin film of titanium and copper by etching.

In order to cause the first active metal layer to exist on the inner face of the through hole, at least one selected from titanium powder, zirconium powder, hafnium powder, and niobium powder is added to the first metal paste. Addition is preferably carried out so that the amount added is 1% by mass or more and 8% by mass or less of a total of 100% by mass of the powders constituting the first metal paste.

In order to include a refractory metal in the through conductor 2, at least one selected from molybdenum powder, tantalum powder, osmium powder, rhenium powder, and tungsten powder is added to the first metal paste. Addition is preferably carried out so that the amount added is 3% by mass or more and 20% by mass or less of a total of 100% by mass of the powders constituting the first metal paste.

In order to cause the through conductor 2 to have a plurality of the extended portions 7 extending from the inner face of the through hole toward the base 1, the through hole is formed using a YAG laser. By forming the through hole in this way, a plurality of cavity portions which form the extended portion 7 are formed in the inner face of the through hole. If an average crystal grain size of the aluminum nitride constituting the base 1 is 3 to 15 μm, an average length of the cavity portions obtained when forming the through hole using a YAG laser is 5 μm or more and 20 μm or less, and therefore an average length of the extended portions 7 when forming the through conductor 2 is 5 μm or more and 20 μm or less.

In order to cause the second active metal layer to exist between the base 1 and metal layer 3, at least one selected from titanium powder, zirconium powder, hafnium powder, and niobium powder is added to the second metal paste. Addition is preferably carried out so that the amount added is 1% by mass or more and 8% by mass or less of a total of 100% by mass of the powders constituting the second metal paste.

In order to cover the metal layer 3 with a coating layer composed of at least one selected from silver, copper, nickel, palladium, platinum, and gold, coating is carried out using a commonly-known plating method.

Heretofore, one example of a method for manufacturing the circuit substrate 10 of the present disclosure has been described, but a method for manufacturing the circuit substrate 10 of the present disclosure is not limited to the manufacturing method heretofore described. For example, a multiple of the circuit substrates 10 can be formed by using the base 1 in which dividing grooves are formed.

Next, as an example of a method for manufacturing the electronic device 20 of the present disclosure, a method for manufacturing the electronic device 20 of the configuration shown in FIG. 5 will be described. Firstly, the electronic device 20 of the present disclosure can be obtained by preparing the circuit substrate 10 obtained using the heretofore described manufacturing method, and mounting the electronic component 4 on the metal layer 3.

Hereafter, examples of the present disclosure will be specifically described, but the present disclosure is not limited to the following examples.

First Example

Metal pastes of differing compositions were prepared, and an indentation of a metal layer surface corresponding to a top of a through conductor and the section shown in FIG. 1 were observed.

Firstly, a base containing aluminum nitride as a main component and having a thickness of 0.38 mm was prepared using a commonly-known method, and the base was subjected to heat treatment at a temperature of 850° C. in an atmospheric environment. Subsequently, a through hole with a diameter of 100 μm was formed by blasting. Then, silver powder with an average particle size of 2.5 μm, copper powder with an average particle size of 2.5 μm, and an organic vehicle were prepared.

As samples of the present disclosure, a mass ratio of components constituting the first metal paste was a silver-copper ratio of 65:35, and a mass ratio of components constituting the second metal paste was a silver-copper ratio of 70:30. Regarding samples of a comparative example, mass ratios of components constituting the first metal paste and second metal paste were a silver-copper ratio of 72:28 (a eutectic composition) for both the first metal paste and second metal paste.

Next, the prepared first metal paste was filled in the through hole of the base and dried. Then, using a screen printing method, the second metal paste was printed so as to cover the dried first metal paste, and dried. A thickness thereof was regulated so that the thickness of the metal layer after calcination was 15 μm. Subsequently, heat treatment was carried out under conditions so that the circuit substrate was held at a maximum temperature of 820° C. in a vacuum environment for 5 minutes, to obtain circuit substrates of the present disclosure and comparative example.

Then, when the respective circuit substrates were observed, shrinkage caused by alloy formation was large in the circuit substrate of the comparative example, and therefore the metal layer surface corresponding to the top of the through conductor was considerably indented. To the contrary, indentation of the metal layer surface in the circuit substrate of the present disclosure was small.

Regarding the circuit substrate of the present disclosure, observation was carried out with using an SEM, and line analysis was carried out with using an EDX, with the section shown in FIG. 1 as a measurement face. It was confirmed that a eutectic region of silver and copper existed in a region on the metal layer side in a diametrically center region of the through conductor. It was also confirmed that a non-eutectic region of silver and copper existed in a central region of the diametrically center region. From this result, it has been seen that the circuit substrate of the present disclosure has good heat dissipation and junction reliability.

Second Example

Metal pastes of differing compositions were prepared, and confirmation of thermal reliability was carried out. Firstly, a base which contained aluminum nitride as a main component and in which a through hole was formed by blasting, was prepared using a commonly-known method. Silver powder with an average particle size of 2.5 μm, copper powder with an average particle size of 2.5 μm, titanium powder with an average particle size of 1.0 μm, and an organic vehicle were prepared.

Then, a paste in which a mass ratio of components constituting the first metal paste was a silver-copper ratio of 65:35 (paste 1), and a paste in which a mass ratio was a silver-copper-titanium ratio of 64:34:2 (paste 2), were prepared as first metal pastes. A paste in which a mass ratio of components constituting the second metal paste was a silver-copper ratio of 70:30 (paste 3), and a paste in which a mass ratio was a silver-copper-titanium ratio of 69:29:2 (paste 4), were prepared as second metal pastes.

Circuit substrates were formed using the same method as in the first example, except that Sample No. 1 was a combination of paste 1 and paste 3 (the same as in the first example), Sample No. 2 was a combination of paste 2 and paste 3, and Sample No. 3 was a combination of paste 2 and paste 4.

Then, when area analysis was carried out on the section shown in FIG. 1 using the EDX, with regard to Sample No. 1, there was no position in which titanium and nitrogen existed together. With regard to Sample No. 2, it was confirmed that a position in which titanium and nitrogen existed together followed the inner face of the through hole, and the first active metal layer existed on the inner face of the through hole. With regard to Sample No. 3, it was confirmed that the first active metal layer existed on the inner face of the through hole, and the second active metal layer existed between the base 1 and metal layer 3.

Next, as a test for confirming thermal reliability, a heat cycle test having as one cycle a cycle of lowering the environmental temperature of each sample from room temperature to −45° C., holding the temperature for 15 minutes, raising the temperature and holding at 145° C. for 15 minutes, and then lowering the temperature to the room temperature, was carried out using a thermal shock testing device. The respective samples were test pieces having the section shown in FIG. 1, and the existence or absence of separation between the inner face of the through hole and the through conductor, and between the base and the metal layer, was confirmed after 1000 cycles.

When the results were arranged in order of least separation, the order is sample Nos. 3, 2, and 1, and it has been seen that thermal reliability increases owing to existence of an active metal layer.

Third Example

Firstly, a base which contained aluminum nitride as a main component and in which a through hole was formed by blasting, was prepared using a commonly-known method. Also, silver powder with an average particle size of 2.5 μm, copper powder with an average particle size of 2.5 μm, titanium powder with an average particle size of 1.0 μm, molybdenum powder with an average particle size of 3.0 μm, and an organic vehicle were prepared.

Then, a circuit substrate was formed using the same method as in the first example, except that a paste in which a mass ratio of components constituting the first metal paste was a silver-copper-titanium-molybdenum ratio of 54:28:3:15 was prepared as the first metal paste, and paste 4 of the second example was used as the second metal paste.

Since the circuit substrate obtained in this way was configured so that indentation thereof was smaller than that of the sample of the present disclosure prepared in the first example, and the circuit substrate contained a refractory metal, it has been seen that indentation in the surface of the metal layer above the through conductor can be reduced.

Fourth Example

Samples in which the average crystal grain size of the aluminum nitride constituting the base and the through hole formation method were changed were prepared, and confirmation of thermal reliability was carried out. Firstly, a base containing aluminum nitride as a main component, wherein the average crystal grain size of the aluminum nitride was a value shown in Table 1, was prepared using a commonly-known method. Then, a through hole was formed in the base using a method shown in Table 1.

Next, a circuit substrate was formed using the same method as for Sample No. 3 of the second example. Sample No. 4 shown in Table 1 was the same sample as Sample No. 3 of the second example. Then a heat cycle test was carried out using the same method as in the second example as a test for confirming thermal reliability, and the existence or absence of separation between the inner face of the through hole and the through conductor was confirmed.

Results are shown in Table 1. The results are arranged in order of least separation in Table 1, with the sample in first position having the least separation, and the sample in sixth position having the most separation.

TABLE 1

| Sample No. | Through Hole Formation Method | Aluminum Nitride Average Crystal Grain Diameter (μm) | Existence of Extended Portion | Average Length of Extended Portion (μm) | Order |
|---|---|---|---|---|---|
| 4 | Blasting | 9 | No | — | 6 |
| 5 | YAG laser | 2 | Yes | 3 | 5 |
| 6 | YAG laser | 3 | Yes | 5 | 3 |
| 7 | YAG laser | 9 | Yes | 15 | 1 |
| 8 | YAG laser | 15 | Yes | 20 | 2 |
| 9 | YAG laser | 20 | Yes | 22 | 4 |

In the results shown in Table 1, since sample Nos. 5 to 9 have less separation than sample No. 4, it has been seen that thermal reliability increases owing to the existence of an extended portion. Since Sample Nos. 6 to 8 have particularly little separation, it has been seen that thermal reliability increases further owing to the average length of the extended portions of 5 μm or more and 20 μm or less.

REFERENCE SIGNS LIST

1: Base
2: Through conductor
3: Metal layer
4: Electronic component
5: First face
6: Second face
7: Extended portion
10: Circuit substrate
20: Electronic device

The invention claimed is:
1. A circuit substrate, comprising:
a base comprising a ceramic material,
   wherein the base has a first face and a second face, and
   wherein the base defines a through hole from the first face to the second face;
a through conductor containing, as main components, silver and copper,
   wherein the through conductor is inside the through hole, and
   wherein the through conductor has a plurality of surfaces; and
a metal layer in contact with at least one of the plurality of surfaces,
wherein the through conductor includes a eutectic region of silver and copper, in a metal layer side of a diametrically center region of the through conductor, and
wherein the through conductor further includes a non-eutectic region of silver and copper, in a central region of the diametrically center region of the through conductor.
2. The circuit substrate according to claim 1,
wherein the metal layer contains silver and copper.
3. The circuit substrate according to claim 1, further comprising:
a first active metal layer between the base and the through conductor,
wherein the base contains a component, and
wherein the first active metal layer contains
   the component, and
   at least one selected from titanium, zirconium, hafnium, and niobium.

4. The circuit substrate according to claim 1,
wherein the through conductor further contains at least one selected from molybdenum, tantalum, osmium, rhenium, and tungsten.

5. The circuit substrate according to claim 1,
wherein the ceramic material is a nitride-based ceramic material.

6. The circuit substrate according to claim 1,
wherein the base has an inner face, and
wherein the through conductor has a plurality of extended portions extending through the inner face of the base.

7. The circuit substrate according to claim 6,
wherein the extended portions have an average length of 5 µm or more and 20 µm or less.

8. The circuit substrate according to claim 1, further comprising:
a second active metal layer between the base and the metal layer,
wherein the second active metal layer contains
a component constituting the base, and
at least one selected from titanium, zirconium, hafnium, and niobium.

9. The circuit substrate according to claim 1, further comprising:
a coating layer on the metal layer,
wherein the coating layer contains at least one selected from silver, copper, nickel, palladium, platinum, and gold.

10. An electronic device, comprising:
the circuit substrate according to claim 1; and
an electronic component on the circuit substrate.

11. A circuit substrate, comprising:
a base comprising a ceramic material,
  wherein the base has a first face and a second face, and
  wherein the base defines a through hole from the first face to the second face;
a through conductor containing, as main components, silver and copper,
  wherein the through conductor is inside the through hole, and
  wherein the through conductor has a plurality of surfaces; and
a metal layer in contact with at least one of the plurality of surfaces,
wherein the through conductor includes a eutectic region of silver and copper, in a metal layer side of a diametrically center region of the through conductor,
wherein the through conductor further includes a non-eutectic region of silver and copper, in a central region of the diametrically center region of the through conductor, and
wherein the through conductor further contains at least one selected from molybdenum, tantalum, osmium, rhenium, and tungsten.

12. A circuit substrate, comprising:
a base comprising a ceramic material,
  wherein the base has a first face and a second face, and
  wherein the base defines a through hole from the first face to the second face;
a through conductor containing, as main components, silver and copper,
  wherein the through conductor is inside the through hole, and
  wherein the through conductor has a plurality of surfaces; and
a metal layer in contact with at least one of the plurality of surfaces,
wherein the through conductor includes a eutectic region of silver and copper, in a metal layer side of a diametrically center region of the through conductor,
wherein the through conductor further includes a non-eutectic region of silver and copper, in a central region of the diametrically center region of the through conductor,
wherein the base has an inner face, and
wherein the through conductor has a plurality of extended portions extending through the inner face toward the base.

13. The circuit substrate according to claim 1,
wherein the diametrically center region is a middle region of a distance from one inner face of the through hole to another inner face divided into three equal portions in a section cut in a thickness direction of the base so that a volume of the through conductor is in approximately equal portions,
wherein the metal side layer is a region on the metal side layer of regions in which a distance from the first face to the second face of the base is divided into three equal portions in the diametrically center region, and
wherein the central region is a region in the center of the regions in which the distance from the first face to the second face of the base is divided into three equal portions in the diametrically center region.

14. The circuit substrate according to claim 13,
wherein the eutectic region is larger than the non-eutectic regions in the region on the metal layer side, and
wherein the non-eutectic region is larger than the eutectic regions in the central region.

* * * * *